United States Patent [19]

Kleiner et al.

[11] 3,878,533

[45] Apr. 15, 1975

[54] HIGH SPEED ANALOG TO DIGITAL CONVERTER RECIRCULATING ANALOG INPUT FOR HIGH SPEED OUTPUT

[75] Inventors: Norbert Kleiner, Oakton; Hill Montague, Reston, both of Va.

[73] Assignee: Scope Incorporated, Reston, Va.

[22] Filed: Mar. 22, 1974

[21] Appl. No.: 453,773

[52] U.S. Cl. .......... 340/347 AD

[51] Int. Cl. .......... H03k 13/02

[58] Field of Search .......... 340/347 AD; 235/154; 324/99 D; 332/11 R; 178/43.5

[56] References Cited

UNITED STATES PATENTS

| | | | |
|---|---|---|---|
| 2,832,827 | 4/1958 | Metzger | 340/347 AD X |
| 3,164,826 | 1/1965 | McGrogan, Jr. | 340/347 AD |
| 3,488,762 | 1/1970 | Minejima et al. | 340/347 AD |

*Primary Examiner*—Charles D. Miller

[57] ABSTRACT

In an analog to digital converter an analog voltage is sampled. To provide a digital output indicative of one sample, the analog voltage sample is recirculated. During each successive circulation, a successively less significant bit of the digital output is determined by comparing a DC level dependent upon the analog input level to a reference level in a single level comparator. A power divider in the single level comparator couples direct current inputs to the comparator and to a combiner. The combiner has an output connected to a feedback loop including a hard limited modulated channel, the output of which is amplified and coupled to the input of the power divider. The comparator thus provides successive digital bits upon the completion of each recirculation.

9 Claims, 1 Drawing Figure

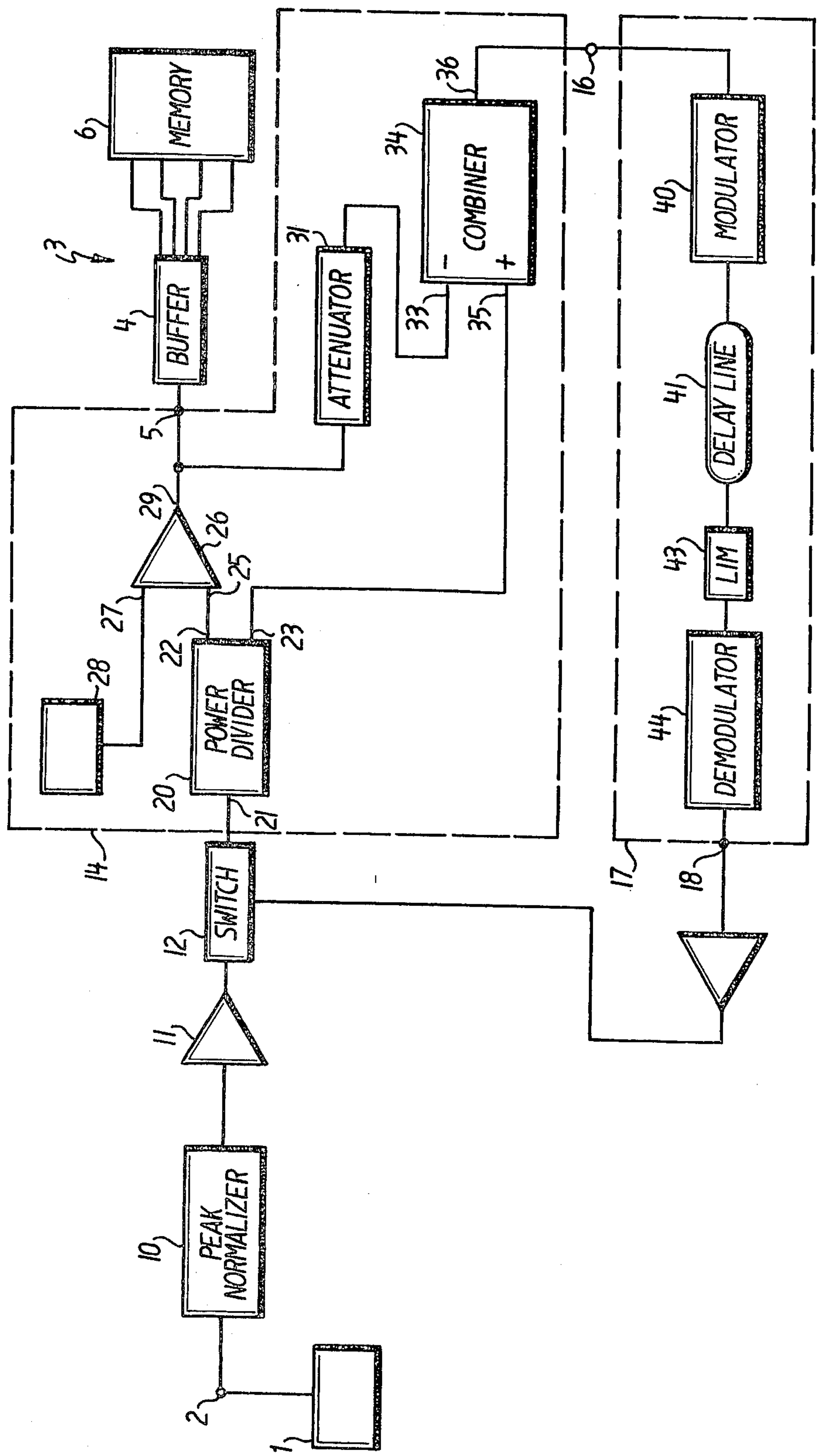
MEMORY
BUFFER
ATTENUATOR
COMBINER
MODULATOR
DELAY LINE
LIM
DEMODULATOR
POWER DIVIDER
SWITCH
PEAK NORMALIZER

HIGH SPEED ANALOG TO DIGITAL CONVERTER RECIRCULATING ANALOG INPUT FOR HIGH SPEED OUTPUT

This invention relates to signal conversion, and more particularly to a high speed analog to digital converter supplying a digital number output indicative of an analog level input.

In one form of analog to digital converter, it is desired to provide a binary output number indicative of a direct current level. In other words, a signal comprising succession of bits, each bit comprising a logic one or a logic zero, is supplied to storage or utilization means. Each bit represents a digit in a binary number which describes the level of the analog signal.

One prior art technique for providing such a digital number is the introduction of the analog signal to a bank of comparators, each comparator providing an output indicative of a particular digital level. The number of comparators provided is determined by the degree of precision desired in the output. It is necessary to connect the comparators to digital logic to code the outputs of the comparators into a binary number. Similarly, a single comparator may be used connected to receive inputs from an $n$-bit binary counter. In this situation, the length of the counter determines output precision. In the first prior arrangement, obtaining high resolution depends on the use of many comparators. In high speed data processing systems, such as those operating at 100,000,000 samples per second or greater, slight differences in individual comparator characteristics may cause substantial error. In the second prior example, high speed operation is limited. To obtain $n$-bit resolution, the binary counter must count through its entire $n$-bit length within one operating cycle. Thus, one operating cycle would have to be substantially longer than the speed capability of one counter. In both situations, either a large number of counter stages or a large number of comparator stages must be provided. This increases the cost of production of solid state circuitry considerably.

SUMMARY OF THE INVENTION

It is therefore an object of the present invention to provide an analog to digital converter for providing a binary number indicative of an analog voltage level capable of high resolution but constructed with a minimum number of stages.

It is also an object of the present invention to provide an analog to digital converter of the type described capable of high resolution and high operating speed.

It is a further object of the present invention to provide an analog to digital converter which provides both high speed and high resolution and is not subject to errors due to non-uniformity of components.

It is a more specific object of the present invention to provide an analog to digital converter of the type described in which successive comparisons of recirculated portions of an input signal to a reference are performed.

It is also a specific object of the present invention to provide an analog to digital converter of the type described which uses a hard limited frequency modulated channel in the recirculation loop in order to suppress signal distortions.

It is still another object of the present invention to provide an analog to digital converter of the type described providing a selectable degree of resolution without requiring any changes in conversion circuitry.

It is another general object of the present invention to provide an analog to digital converter which divides an analog input signal into successive time increments and performs analog to digital conversion for each increment one bit at a time, whereby the most significant bit for each time sample is obtained, and in each successive recirulation, the sample contains one less significant digit.

Briefly stated, in accordance with the present invention, in the preferred form, in an analog to digital converter, a data sample is circulated. During successive circulations, successively less significant digits of the digital output are determined by comparing a DC level responsive to the analog input to a reference level in a single level comparator. A power divider in the single level comparator couples direct current input to the comparator and to a combiner. The combiner has an output connected to a feedback loop including a hard limited modulated channel, the output of which is amplified and coupled to the input of the power divider. The comparator thus provides successive digital bits upon the completion of each recirculation to provide a digital output corresponding to one digital sample.

BRIEF DESCRIPTION OF THE DRAWING

The means by which the foregoing objects and features of novelty are achieved are pointed out with particularity in the claims forming the concluding portion of the specification. The invention, both as to its organization and manner of operation may be further understood by reference to the following description taken in connection with the drawing, which is a block diagrammatic representation of an analog to digital converter constructed in accordance with the present invention.

DESCRIPTION OF THE PREFERRED EMBODIMENT

Referring now to the drawing, there is illustrated an analog to digital converter constructed in accordance with the present invention. An analog signal input is obtained from a source 1 at a terminal 2, and a digital output comprising a binary number indicative thereof is supplied to utilization means 3. In the present embodiment, the utilization means 3 comprises a buffer 4 connected to an output terminal 5 of the analog to digital converter and providing an output to a memory 6. The utilization means 3 may include other well-known digital circuitry. The input terminal 2 is connected to a peak normalizer circuit 10 which may be described as a limiting circuit. The analog source 1 provides a signal having an input voltage level of $V(t)$. The peak normalizer circuit 10 is a conventional variable gain circuit containing the peak input voltage at or below a level of $V_{max}$. The peak normalizer 10 provides a voltage coupled by an amplifier 11 to a switch 12. The switch 12 provides an output to a single level comparator 14. The single lever comparator 14 provides the analog to digital converter output at the output terminal 5 and has a feedback output terminal 16 connected to a hard limited modulated channel 17. The hard limited modulated channel 17 may, for example, be frequency or phase modulated, and has an output terminal 18 coupled by an amplifier 19 to a second input of the switch 12. The single level comparator comprises a power divider 20 having an input 21 coupled to the output of the switch 12 and having first and second outputs 22 and 23. The output 22 is connected to an input 25 of a comparator 26 for comparison with a reference voltage source 28 connected to an input 27 of the one-bit comparator 26. An output terminal 29 of the one-bit comparator 26 is connected to the output terminal 5. The one-bit comparator 26 provides the successive bits comprising the digital output at the output terminal 5 in a manner described below. The output 29 is also coupled by an attenuator 31 to an input 33 of a combiner 34. An input 35 of the combiner 34 is coupled to the output terminal 23 of the power divider 20, and an output 36 of the combiner 34 is connected to the feedback output terminal 16.

The hard limited modulated channel 17 includes a modulator 40 having its input connected to the terminal 16 and its output connected to a delay line 41. The delay line 41 provides an input to a limiter 43. A demodulator 44 is connected to the output of the limiter 43 and provides an output to the terminal 18 for coupling to the switch 12 to complete the recirculation path. In embodiments in which the hard limited modulated channel 17 is phase modulated, the modulator 40 comprises a phase modulator and the demodulator 44 comprises a double balanced mixer. Alternatively the modulator 40 may comprise a well-known voltage controlled oscillator, and the demodulator 44 may comprise a discriminator, to provide for a frequency modulated channel.

OPERATION OF THE CIRCUIT

Upon detection of an input signal supplied to the analog to digital converter, the switch 12 is opened for a time aperture corresponding to the time delay provided by the delay line 41 in the hard limited modulated channel 17. This switching is accomplished by conventional means in the switch 12. Thereafter, the switch 12 closes, and the signal is provided to the single level comparator 14. The power divider 20 divides the incoming signal into two paths. The voltage V($t$) is supplied at the output 22 to the one-bit comparator 26, and the input signal reduced, for example, by 3 dB provided at the output 23. In the preferred embodiment, the voltage level supplied by the reference source 28 is chosen to be one half $V_{max}$. Thus, the one-bit comparator 28 compares V($t$) to one half $V_{max}$. If V($t$) exceeds one half $V_{max}$, the comparator 26 provides a logic one at the output terminal 5, and if not, a logic zero is provided at the output terminal 5. Voltage levels corresponding to the logic ones or zeros are adjusted to the levels one half $V_{max}$ and zero, respectively, by the attenuator 31. The output of the attenuator 31 and the output appearing at the output 23 of the power divider 20 are combined in the combiner 33. The output of the combiner 33 is coupled to the hard limited modulated channel 17 in order to suppress signal distortion. The voltage at the terminal 16 is converted by the modulator 40 to a suitable voltage-dependent parameter such as frequency, phase or the output of the modulator 40 is delayed by the delay line 41 for a selected period which is determined on the basis of the time necessary to perform a comparison in the single level comparator 14. The limiter 43 limits the output of the delay line 41 and a direct current voltage indicative of the parameter of the output of the modulator 40 is provided by the demodulator 44 at the output terminal 18. The above description defines the structure and operation of a "hard limited modulated channel." The amplifier 19 compensates for losses in the single level comparator 14 and the hard limited modulated channel 17. Additionally, in the preferred embodiment, the amplifier 19 provides a net voltage gain of two. This voltage gain adjusts the signal residue out of the combiner 33 into the voltage range of zero volts to $V_{max}$. In this manner, the most significant digit of the binary output number is obtained. At the completion of this cycle, the above-described operation is repeated. However, since the voltage now supplied to the input switch 12 is a function of one half the input voltage V($t$), the above-described process will provide the second most significant digit of the binary output number. Additionally, as many recirculations as are programmed into the timing means 13 are performed to provide the desired resolution.

A typical amplifier characteristic may be expressed as $V_o=\tanh(V_i)$ where $V_i$ and $V_o$ are normalized input and output voltages, respectively. In the preferred embodiment, the amplifier 19 is selected such that $V_{max}$ is related to $V_i$ to maintain amplifier error due to nonlinearity below the level of the least significant bit to be resolved. Of course, resolution is also limited by the lowest level to which the components of the single level comparator 14 are responsive.

The maximum speed of analog to digital conversion is determined by the speed at which the one-bit comparator 26 can operate. The number of bits of resolution in the analog to digital converter is also determined by the maximum power output of the amplifier B, the noise levels of the amplifiers A and B, respectively, and the sensitivity of the one-bit comparator 26. Indeed, with state-of-the-art components, a 500 megasample per second conversion to a resolution of eight bits appears to be feasible.

The binary data appearing at the output terminal 5 in one embodiment is received by the buffer 4 for provision to conventional, lower speed information storage means such as the memory 6, magnetic tape (not shown), display means (not shown), or any other desired utilization means.

What is thus provided is an analog to digital converter where a one-bit comparison is performed to obtain a most significant digit and in which signal residue is recirculated and multiplied so that less significant digits may be obtained in successive circulations in the same one-bit comparator by means of comparison to the same single reference level. In this manner, ease of construction is facilitated, reliability and accuracy are enhanced, and in many applications, cost is significantly reduced.

What is claimed is:

1. An analog to digital converter for providing a binary output indicative of an analog input comprising, in combination:

a switching circuit connected between the analog signal and an output terminal and being operable for a selectable period;

a single level comparator having an input terminal connected to the output of said switch and an output terminal, and further comprising a feedback terminal; and a hard limited modulated channel connected between said feedback terminal and a second input of said switch, said switch including timing means for coupling a sample to said single level comparator and for connecting recirculated feedback from said feedback terminal to said input of said single level comparator, said single level comparator comprising a power divider having an input connected to the input of said single level comparator and first and second outputs, a one-bit comparator having a first input connected to an output of said power divider and a second input connected to a source of reference potential and an output connected to said output terminal, a combiner having a first input coupled to said one-bit comparator and a second input coupled to said power divider and an output coupled to said feedback terminal, and said hard limited modulated channel comprising a modulator, delay means and a demodulator connected in series.

2. An analog to digital converter according claim 1 in which said modulator in said hard limited modulated channel comprises a voltage controlled oscillator and in which said demodulator comprises a discriminator.

3. An analog to digital converter according to claim 1 wherein limiting means are coupled to the input terminal of said switch for normalizing peaks of the input voltage to said analog to digital converter to a level of $V_{max}$ and in which the value of reference potential connected to said one-bit comparator in said single level comparator is ½ $V_{max}$.

4. An analog to digital converter according to claim 3 further comprising an attenuator connected between the output of said one-bit comparator and said first input of said combiner.

5. The analog to digital converter of claim 4 in which the delay period of said delay means in said hard limited modulated channel is set to be equal to the period of said input switching circuit.

6. An analog to digital converter according to claim 5 further comprising an amplifier connected between said hard limited modulated channel and said second input of said switching circuit.

7. An analog to digital converter according to claim 6 in which said modulator in said hard limited modulated channel comprises a phase modulator and in which said demodulator comprises a double balanced mixer.

8. An analog to digital converter according to claim 7 in which said attenuator is adjusted to provide an output of zero in response to a logic zero at the output of said one-bit comparator and to provide an output of one half $V_{max}$ in response to a logic one output at the output of said one-bit comparator, said power divider provides a three dB reduction at said second output, and in which said amplifier provides a multiplication factor of two, whereby on successive recirculations the input to said switch means is raised to the range of zero to $V_{max}$ and losses are compensated for.

9. An analog to digital converter according to claim 8 further comprising a limiter in said hard limited modulated channel connected between said delay means and said double balanced mixer whereby signal fluctuations are minimized.

* * * * *